US011075502B2

(12) United States Patent
Kuo et al.

(10) Patent No.: US 11,075,502 B2
(45) Date of Patent: Jul. 27, 2021

(54) LASER DIODE DRIVER CIRCUIT TECHNIQUES

(71) Applicant: Analog Devices, Inc., Norwood, MA (US)

(72) Inventors: Shawn S. Kuo, Arlington, MA (US); Ronald A. Kapusta, Carlisle, MA (US); Xu Tang, Sudbury, MA (US); Leonard Shtargot, Campbell, CA (US); Eugene L. Cheung, Fremont, CA (US); Jonathan Paolucci, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 53 days.

(21) Appl. No.: 16/555,506

(22) Filed: Aug. 29, 2019

(65) Prior Publication Data

US 2021/0066885 A1    Mar. 4, 2021

(51) Int. Cl.
*H01S 5/042* (2006.01)
*H01S 5/068* (2006.01)
*H01S 5/06* (2006.01)
*H02M 3/08* (2006.01)
*H01S 5/026* (2006.01)
*H01S 5/0625* (2006.01)

(52) U.S. Cl.
CPC .......... *H01S 5/0428* (2013.01); *H01S 5/0261* (2013.01); *H01S 5/0608* (2013.01); *H01S 5/06808* (2013.01); *H02M 3/08* (2013.01); *H01S 5/06253* (2013.01)

(58) Field of Classification Search
CPC .. H01S 5/0428; H01S 5/0608; H01S 5/06253; H01S 5/062; H01S 5/06; H01L 33/64; H01L 33/508; H02M 3/08

USPC ................................................. 372/25, 38.02
See application file for complete search history.

(56) References Cited

U.S. PATENT DOCUMENTS

| 3,887,836 A | 6/1975 | Leete |
| 3,976,932 A | 8/1976 | Collins |
| 5,132,553 A | 7/1992 | Siegel |

(Continued)

FOREIGN PATENT DOCUMENTS

| CN | 101637065 B | 11/2011 |
| CN | 101442858 B | 6/2012 |

(Continued)

OTHER PUBLICATIONS

"How to Build an Ultra-Fast High-Power Laser Driver—That Sees Farther, Better, and at a Lower Cost!", How2AppNote 002, Efficient Power Conversion Corp. (EPC), (2018), 2 pgs.

(Continued)

*Primary Examiner* — Tuan N Nguyen
(74) *Attorney, Agent, or Firm* — Schwegman Lundberg & Woessner, P.A.

(57) ABSTRACT

Techniques to achieve higher power/shorter pulses with a laser diode. By initially applying a static reverse bias across the laser diode, the laser diode can turn on at a larger inductor current. When the laser diode is initially reverse biased, depletion charge and diffusion charge can be populated before the laser diode will lase. This causes the laser diode to initially turn on at a larger inductor current, which will reduce the rise time, thereby achieving higher power/ shorter pulses.

21 Claims, 10 Drawing Sheets

(56) References Cited

U.S. PATENT DOCUMENTS

| | | |
|---|---|---|
| 5,287,372 A | 2/1994 | Ortiz |
| 5,416,387 A | 5/1995 | Cuk et al. |
| 5,604,759 A | 2/1997 | Miyaki et al. |
| 5,610,452 A | 3/1997 | Shimer et al. |
| 5,869,988 A | 2/1999 | Jusuf et al. |
| 5,895,984 A | 4/1999 | Renz |
| 6,259,714 B1 | 7/2001 | Kinbara |
| 6,697,402 B2 | 2/2004 | Crawford |
| 6,731,449 B2 | 5/2004 | Okazaki et al. |
| 7,161,818 B2 | 1/2007 | Kirchmeier et al. |
| 7,180,921 B2 | 2/2007 | Mangano et al. |
| 7,426,226 B2 | 9/2008 | Motoyama |
| 7,492,800 B2 | 2/2009 | Bozso et al. |
| 7,545,839 B2 | 6/2009 | Giorgi et al. |
| 7,638,954 B2 | 12/2009 | Kunimatsu et al. |
| 7,768,322 B2 | 8/2010 | Sanduleanu et al. |
| 7,782,027 B2 | 8/2010 | Williams |
| 7,969,558 B2 | 6/2011 | Hall |
| 7,978,743 B2 | 7/2011 | Deppe et al. |
| 8,148,919 B2 | 4/2012 | Liu et al. |
| 8,228,001 B2 | 7/2012 | Fan |
| 8,461,775 B2 | 6/2013 | Choutov et al. |
| 8,559,098 B2 | 10/2013 | Liero et al. |
| 8,680,781 B1 | 3/2014 | Pflaum |
| 8,847,511 B1 | 9/2014 | Cheng et al. |
| 9,054,485 B1 | 6/2015 | Ng |
| 9,123,467 B2 | 9/2015 | Wu et al. |
| 9,185,762 B2 | 11/2015 | Mark et al. |
| 9,300,113 B2 | 3/2016 | Hoffman et al. |
| 9,357,596 B2 | 5/2016 | Rouvala et al. |
| 9,368,936 B1 | 6/2016 | Lenius et al. |
| 9,817,122 B2 | 11/2017 | Metzler et al. |
| 9,846,319 B2 | 12/2017 | Bergmann et al. |
| 9,847,736 B2 | 12/2017 | Grootjans et al. |
| 9,923,334 B2 | 3/2018 | Stiffler et al. |
| 10,103,513 B1* | 10/2018 | Zhang .................. H01S 5/0428 |
| 10,141,716 B1 | 11/2018 | Lenius et al. |
| 10,158,211 B2 | 12/2018 | Barnes et al. |
| 10,250,011 B2 | 4/2019 | Van Der Tempel et al. |
| 10,256,605 B2 | 4/2019 | Gassend et al. |
| 2003/0016711 A1 | 1/2003 | Crawford |
| 2004/0037100 A1* | 2/2004 | Orr .................... H02M 3/33561 363/131 |
| 2007/0097044 A1 | 5/2007 | Yang |
| 2007/0268725 A1 | 11/2007 | Hatanaka |
| 2008/0203991 A1 | 8/2008 | Williams et al. |
| 2011/0157251 A1* | 6/2011 | Lim ............... H03K 19/018521 345/690 |
| 2012/0106981 A1 | 5/2012 | Moto et al. |
| 2012/0268969 A1* | 10/2012 | Cuk ........................ H02M 7/48 363/17 |
| 2012/0287678 A1* | 11/2012 | Xu ......................... H02M 3/158 363/17 |
| 2013/0188397 A1* | 7/2013 | Wu .................. H02M 7/53871 363/17 |
| 2013/0313989 A1 | 11/2013 | Chen |
| 2014/0063593 A1 | 3/2014 | Berendt |
| 2014/0211192 A1 | 7/2014 | Grootjans et al. |
| 2017/0085057 A1* | 3/2017 | Barnes .................. H01S 5/0608 |
| 2018/0261975 A1 | 9/2018 | Pavlov et al. |
| 2018/0278017 A1 | 9/2018 | Mignoli et al. |
| 2018/0323576 A1* | 11/2018 | Crawford ......... H03K 17/04123 |
| 2021/0021098 A1 | 1/2021 | Kaymaksut |

FOREIGN PATENT DOCUMENTS

| | | |
|---|---|---|
| CN | 108181621 A | 6/2018 |
| DE | 19943127 C1 | 3/2001 |
| DE | 102006036167 B4 | 2/2011 |
| DE | 102017121114 A1 | 3/2019 |
| DE | 102017121115 A1 | 3/2019 |
| DE | 102018120271 A1 | 3/2019 |
| DE | 102018120624 A1 | 3/2019 |
| EP | 1263140 B1 | 5/2008 |
| EP | 2753898 B1 | 8/2016 |
| EP | 3064957 A1 | 9/2016 |
| JP | H0869631 A | 3/1996 |
| JP | 5159355 B2 | 12/2012 |
| JP | 2016152336 A | 8/2016 |
| KR | 20120129214 A | 11/2012 |
| KR | 101746921 B1 | 6/2017 |
| WO | WO-2010131889 A2 | 11/2010 |

OTHER PUBLICATIONS

Abramov, Eli, et al., "Low Voltage Sub-Nanosecond Pulsed Current Driver IC for High-Resolution LIDAR Applications", IEEE Applied Power Electronics Conference and Exposition (APEC), (2018), 8 pgs.

Curtis, Keith, "Buck Configuration for High-Power LED Driver", Microchip Technology Inc. Data Sheet AN874, (2006), 16 pgs.

Glaser, John S, et al., "High Power Nanosecond Pulse Laser Driver using a GaN FET", PCIM Europe; Intl. Exhibition and Conference for Power Electronics, Intelligent Motion, Renewable Energy and Energy Management, Nuremberg, Germany, (2018), 8 pgs.

Kilpela, Ari, et al., "Laser pulser for a time-of-flight laser radar", Review of Scientific Instruments, 68(6), (Jun. 1997), 6 pgs.

"U.S. Appl. No. 16/517,293, Final Office Action dated Mar. 18, 2021", 9 pgs.

"U.S. Appl. No. 16/517,293, Non Final Office Action dated Dec. 16, 2020", 9 pgs.

"U.S. Appl. No. 16/517,293, Response filed Mar. 9, 2021 to Non Final Office Action dated Dec. 16, 2020", 10 pgs.

"U.S. Appl. No. 16/517,293, Response filed May 18, 2021 to Final Office Action dated Mar. 18, 2021", 10 pgs.

"U.S. Appl. No. 16/517,293, Corrected Notice of Allowability dated Jun. 9, 2021", 2 pgs.

* cited by examiner

LASER DIODE DRIVER CIRCUIT TECHNIQUES

FIELD OF THE DISCLOSURE

This document pertains generally, but not by way of limitation, to integrated circuits, in particular to circuits for driving laser diodes.

BACKGROUND

Many active optical remote sensing systems such as light detection and ranging (LIDAR), time-of-flight cameras, and range finders utilize pulsed semiconductor light sources to illuminate scenes. Optical detectors (also typically based on semiconductors) collect reflected light to determine the presence, distance, size, and speed of objects in a scene. These optical systems have numerous applications, including autonomous navigation, infrastructure monitoring, medicine, and defense. Semiconductor light sources typically utilize diode structures (P-N junctions) that conduct current when forward biased. For semiconductor materials with direct bandgaps, current carriers (electrons and holes) recombine at the junction to produce light in direct proportion to the current. Electronic driver circuits are used to provide this current, where the compliance voltage, current magnitude, and temporal properties of the continuous or pulsed current source vary depending on the requirements of the application, system design, and power supply constraints.

SUMMARY OF THE DISCLOSURE

This disclosure is directed to, among other things, techniques to achieve higher power/shorter pulses with a laser diode. By initially applying a static reverse bias across the laser diode, the laser diode can turn on at a larger inductor current. When the laser diode is initially reverse biased, depletion charge and diffusion charge can be populated before the laser diode will lase. This can cause the laser diode to initially turn on at a larger inductor current, which can reduce the rise time, thereby achieving higher power/shorter pulses.

In some aspects, this disclosure is directed to a diode driver circuit comprising a laser diode, a power supply configured to apply a static reverse bias across the laser diode, and at least one switch configured to control a current through the laser diode.

In some aspects, this disclosure is directed to a method of operating a laser diode, the method comprising coupling a voltage source to a cathode of the laser diode, applying a current pulse through the laser diode, and applying a static reverse bias voltage across the laser diode using the voltage source to decrease the current after firing the laser diode.

In some aspects, this disclosure is directed to a diode driver circuit comprising a laser diode, a power supply coupled to a diode and configured to apply a static reverse bias across the diode, and at least one switch configured to control a current through the laser diode.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Optical systems such as light detection and ranging (LIDAR) systems, time-of-flight cameras, and range finders, can emit one or more pulses of light (e.g., modulated light source) toward one or more objects, and the arrival time of the light reflected from the object(s) is recorded. Based on the arrival time and the speed of light, the distance between the light source and the object(s) can be derived.

A diode can be driven with narrow and high current pulses to emit light pulses onto the object, which can be centimeters to hundreds of meters away. The speed of light is very fast, therefore very short light pulses are needed to achieve meter or centimeter resolution. Accordingly, narrow current pulses are needed to drive the diode to generate the train of short light pulses.

Laser drivers in time of flight (ToF) based LIDAR systems use high powered short pulses from 100 picoseconds (ps) to 100 nanoseconds (ns). The power of these pulses can sometimes be limited by concerns for eye safety. Approaches for architectures for these drivers can include resonant capacitive discharge architectures or hard switching field-effect transistor (FET) architectures. The FETs can be metal-oxide-semiconductor (MOS) FETs or gallium nitride (GAN) FETs, but are not limited to these particular FETs.

For a high-power LIDAR application, the relationship between pulse width and power can be determined by the equation V=L*(di/dt) and some architecture related constants. The voltage V can be set by the voltage of the driver. The inductance L can be determined by the material properties and physical dimensions between the driver and the laser diode. For a given inductance and voltage, the optical power (proportional to current) can be determined by the pulse width. Generally speaking, shorter, higher power pulses can be used to see further, distinguish objects, and stay within the eye safety limit.

In many applications of optical system, e.g., LIDAR system, space is constrained. Space can be limited by the optics, for example, which can require all the laser diodes to be tightly packed. Because the drivers can be physically many times larger than the laser diodes, the drivers will be forced to be spaced far away from the laser diodes, which can increase the loop inductance. The other variable is voltage. If the voltage can be increased with a small impact to area, higher power/shorter pulses can be achieved.

The present inventors have determined that by initially applying a static reverse bias across the laser diode, the laser diode can turn on at a larger inductor current. When the laser diode is initially reverse biased, depletion charge and diffusion charge can be populated before the laser diode will lase. This causes the laser diode to initially turn on at a larger inductor current, which will reduce the rise time, thereby achieving higher power/shorter pulses.

Figure 1:
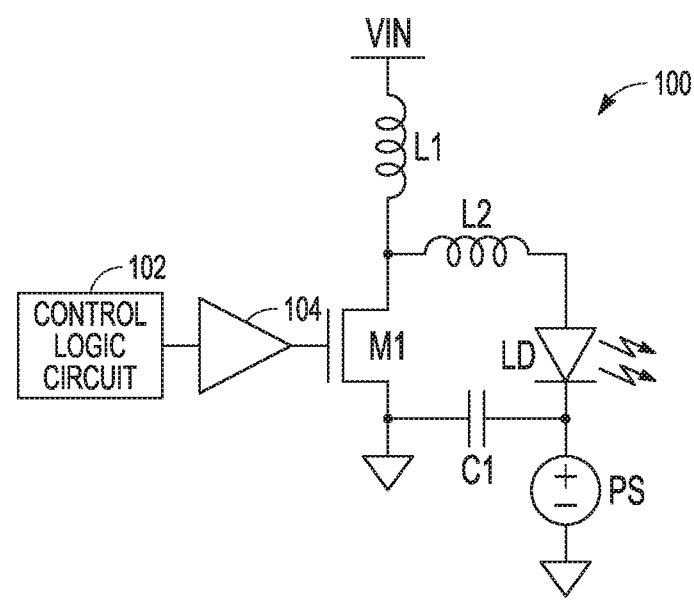
FIG. 1 is a schematic diagram of an example of a laser diode driver circuit that can implement various techniques of this disclosure.

FIG. 1 is a schematic diagram of an example of a laser diode driver circuit that can implement various techniques of this disclosure. The laser diode driver circuit 100 of FIG. 1 can include a charging inductor L1, a parasitic inductance L2, a switch M1 a laser diode LD, an optional capacitor C1, a power source PS, a control logic circuit 102, and a gate driver circuit 104. The charging inductor L1 can be used as a storage element for driving the laser diode LD. The control logic circuit 102 can control the timing of the switch M1 to achieve the desired behavior, e.g., pulse width.

In this disclosure, the switches described can be transistors, such as high-power FETs. The FETs can be metal-oxide-semiconductor (MOS) FETs or gallium nitride (GAN) FETs but are not limited to these particular FETs. Some of the possible implementations of the switch M1 are power MOSFETs, GaN FETs, and silicon carbide (SiC) FETs. The laser diodes described in this disclosure can generate visible light and (near) infrared light, for example.

The gate driver 104 can be coupled to a gate terminal of the switch M1. The gate driver 104 can provide a high amount of charging current to more quickly charge the gate capacitance, which can reduce the turn on time of the switch.

Figure 3:
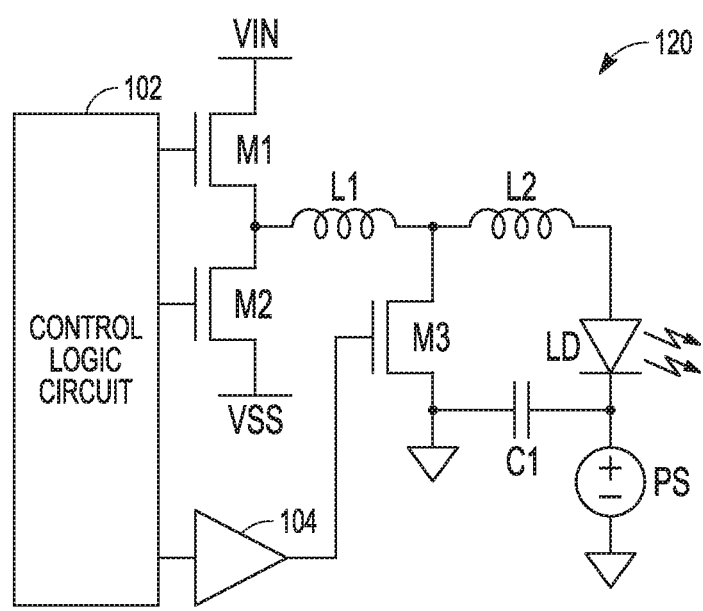
FIG. 3 is a schematic diagram of another example of a laser diode driver circuit that can implement various techniques of this disclosure.

In some example implementations, the switch M1 can be placed tightly with the laser diode LD and the capacitor C1 to minimize the parasitic inductance L2, e.g., conductor traces, package parasitic inductances, and the like. In FIG. 1 and subsequent figures, the inductance coupled to the laser diode anode can be considered to be a lumped representative of the parasitic loop inductance. Any component that is coupled to the parasitic inductance L2 can be considered to be coupled to the laser diode anode. In FIG. 1 and FIG. 3, the parasitic inductance refers to L2 and in FIGS. 5, 6, 7, 8, 11, and 12, the parasitic inductance refers to L1.

In accordance with various techniques of this disclosure, the circuit 100 can include a power supply PS, e.g., a voltage source, coupled to the laser diode LD. The power supply PS can be used to set the operating point of the laser diode. The power supply PS can be implemented using various power converter architectures including, but not limited to, a buck-boost DC-DC converter. The power supply PS can also be derived from another power supply, such as by using a ferrite bead, inductor, diode, resistors, capacitors, or some combination thereof.

The rise time can be reduced by initially applying a static reverse bias across the laser diode using the power supply PS. When the laser diode LD is reverse biased, depletion charge and diffusion charge must be populated before the laser will lase, which can allow the laser diode to initially turn ON at a larger inductor current. The fall time can be reduced by the power supply PS applying a larger reverse voltage on inductor L2 than the laser diode LD, which has its cathode coupled to ground. In conjunction, the rise and fall times are reduced, thereby achieving higher power/shorter pulses.

In some example configurations, the power supply PS can be adjustable. By adjusting the voltage of the power supply, a pulse width of an output pulse of the laser diode can be modified, as described in more detail below. For a given inductance and voltage, the optical power (proportional to current) can be determined by the pulse width.

In some example configurations, the circuit 100 can include an optional capacitor C1 coupled to the laser diode LD. The optional capacitor C1 can provide a lower inductance current return path than the power supply PS to achieve shorter pulses or increase the power for a given pulse width. The capacitor C1 can be included and the power supply PS can drive the cathode (or anode, in some configurations) of the laser diode at low frequencies.

In some example configurations, the capacitance of the capacitor can be adjusted to adjust one or both of a charging voltage of the laser diode and a discharging voltage of the laser diode.

In FIG. 1, a charging circuit path can include an inductive element, e.g., inductor L1, and the switch M1. During a charging phase, the control logic circuit 102 can turn the switch M1 ON and allow the inductive element L1 to charge. During a firing phase, the control logic circuit 102 can turn the switch M1 OFF and allow the inductive element L1 to discharge through the laser diode LD. The operation of the circuit is further described below with respect to FIG. 2.

Figure 2:
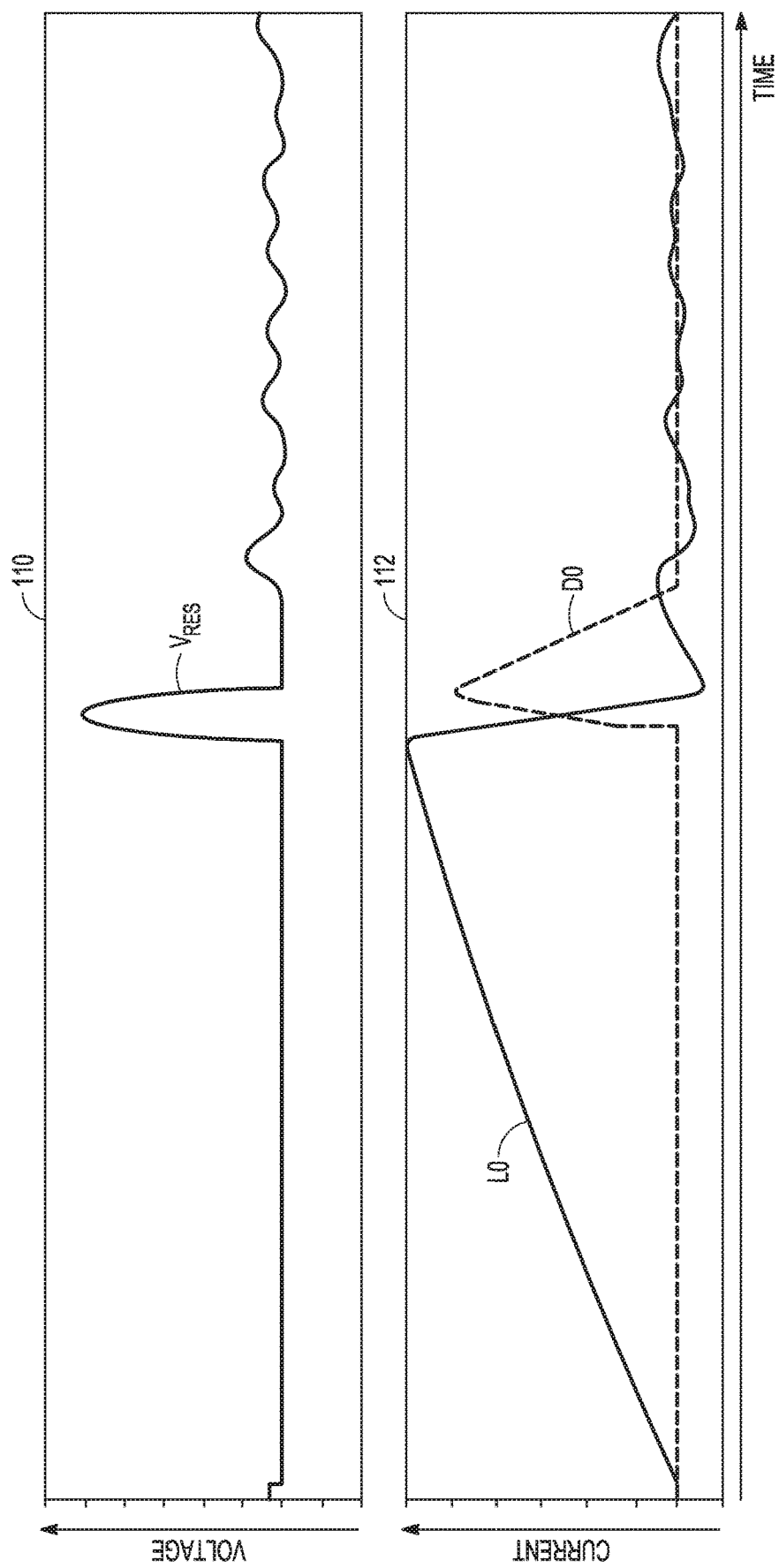
FIG. 2 depicts various waveforms associated with the circuit of FIG. 1.

FIG. 2 depicts various waveforms associated with the circuit of FIG. 1. The x-axis represents time. The top portion 110 depicts the voltage $V_{RES}$ at the drain of the switch M1. The middle portion 112 depicts the inductor current L0 across the charging inductor L1 and depicts the laser diode current D0. The portions are shown in relation to the waveform $V_{CHG}$, which is the switch M1 gate voltage.

As seen in FIG. 2, in the initial charging phase, the control logic circuit 102 of FIG. 1 can turn ON switch M1 and then inductor L1 charges to a desired current, as seen in the middle portion 112. Then, in the firing phase, the control logic circuit 102 of FIG. 1 can turn switch M1 OFF and a large voltage spike occurs at the drain of switch M1, as seen in the top portion 110. This voltage pulse forces a large current into the laser diode LD of FIG. 1 while simultaneously discharging inductor L1, as seen in the middle portion 112. After the voltage at the drain of switch M3 returns to zero, the current in the laser diode LD discharges based on the voltage of the cathode. There can also be an underdamped LC ring before the circuit settles back to the initial state.

FIG. 3 is a schematic diagram of another example of a laser diode driver circuit that can implement various techniques of this disclosure. The driver circuit 120 of FIG. 3 can include a charging inductor L1, a loop inductance L2, switches M1-M3, a laser diode LD, an optional capacitor C1, a power source PS, and a control logic circuit 102. The charging inductor L1 can be used as the storage element for driving the laser diode LD. The control logic circuit 102 can control the timing of the switches M1-M3 to achieve the desired behavior, e.g., optical peak power. In this structure, a high-voltage switch M3, e.g., a GaN FET, can be placed tightly with the laser diode L2 and the optional capacitor C1 to minimize the loop inductance L2.

In some configurations, M2 can be a diode instead of a switch, e.g., transistor. In some configurations, the switch M3 can be a high-voltage FET rated to support high voltage and a large peak current.

The power supply PS can be connected to the laser diode LD, e.g., the cathode of the laser diode LD, in order to set its operating point. The power supply PS can be implemented using various power converter architectures including, but not limited to, a buck-boost DC-DC converter. The power supply PS can also be derived from another power supply, such as by using a ferrite bead, inductor, diode, resistors, capacitors, or some combination thereof.

An inductor L1 can be used as the storage element for driving the laser diode LD. The switches M1 and M2 can be added to drive a current into inductor L1. The control logic circuit 102 can control the timing of the switches to achieve the desired behavior.

A charging circuit path can include an inductive element, e.g., inductor L1, and the switches M1 and M3. During a charging phase, the control logic circuit 102 can control the switches M1 and M3 to turn ON and allow the inductive element to charge. During a firing phase, the control logic circuit 102 can control the switch M3 to turn OFF and allow the inductive element to discharge through the laser diode. During a rest phase, the control logic circuit 102 can control one or both of switches M2 and M3 to turn ON. An operation of the circuit is further described below with respect to FIG. 4.

Figure 4:
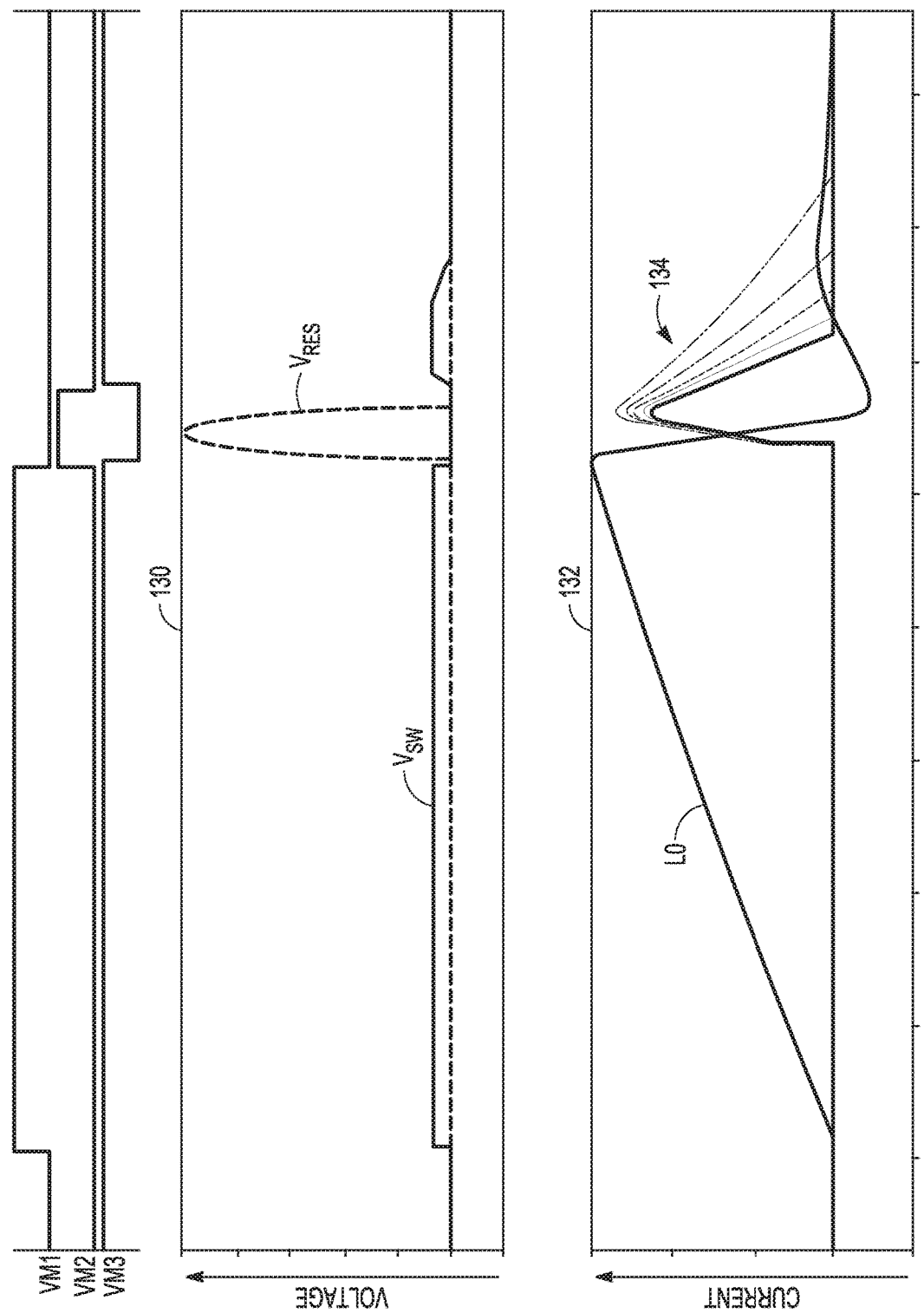
FIG. 4 depicts various waveforms associated with the circuit of FIG. 3.

FIG. 4 depicts various waveforms associated with the circuit of FIG. 2. The x-axis represents time. The top portion 130 depicts the voltage $V_{RES}$ at the drain of the switch M3 and the voltage at the node $V_{SW}$ between the switches M1 and M2. The bottom portion 132 depicts the inductor current L0 across the charging inductors L1 and L2 and depicts various laser diode currents D0 at 134. The various laser diode currents show how the pulse width can be modulated by changing the nominal cathode voltage, for example, of the laser diode LD. The top and bottom portions are shown in relation to the waveform $V_{M1}$, which is the switch M1 gate voltage, the waveform $V_{M2}$, which is an example of a switch M2 gate voltage, and the waveform $V_{M3}$, which is the switch M3 gate voltage.

As seen in FIG. 4, in the initial charging phase, the control logic circuit 102 of FIG. 3 can turn ON the switches M1 and M3 and the inductor L1 charges to a desired current. In the firing phase, the control logic circuit 102 momentarily turns OFF the switch M3, causing a large voltage spike at the drain of the switch M3, as seen in the top portion 130. This voltage pulse quickly charges the input current to the laser diode LD while simultaneously discharging the inductor L1, as seen in the bottom portion 132. After the voltage at drain of the switch M3 returns to zero ($V_{RES}$ in the top portion 130), the control logic circuit 102 of FIG. 3 can turn the switch M3 back ON and the turn OFF of the laser diode LD can be dictated by the power supply, e.g., voltage source, and optional capacitor combination tied to the cathode of the laser diode, for example. During the rest phase, the switch M2 and/or the switch M3 can be ON.

Using the techniques described above with respect to FIGS. 1 and 3, no high voltage inputs are needed to drive the laser diode, which can minimize switching losses that are typically present in voltage-based drivers. The LC settling between the anode and the power supply is a low loss way to recover the energy that was not consumed in the laser diode. Another benefit of this driver circuit is that the fast-rising edge is fixed regardless of pulse width. The larger the current, the higher the voltage that will be forced across the inductor, which can be an advantage in many LIDAR systems that use simplified receiver designs. The architecture is flexible, allowing multiple current levels and pulse widths dictated by the charged inductor current and the bias voltage at the cathode.

Figure 5:
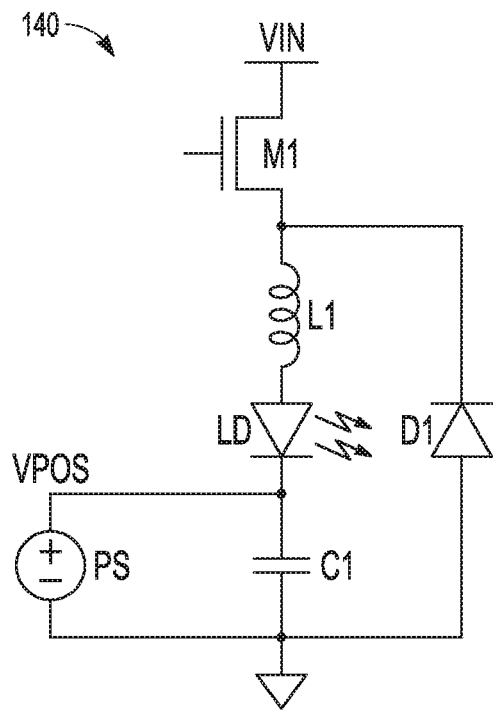
FIG. 5 is a schematic diagram of another example of a laser diode driver circuit that can implement various techniques of this disclosure.

FIG. 5 is a schematic diagram of another example of a laser diode driver circuit that can implement various techniques of this disclosure. The laser driver circuit 140 of FIG. 5 can include a switch M1, a laser diode LD, an optional capacitor C1, a power source PS, and a catch diode D1. A control logic circuit (not depicted) can control the switch M1.

In the example configuration shown in FIG. 5, the power supply PS, e.g., a positive terminal of the power supply, can be coupled to the cathode of the laser diode LD in order to set its operating point. The power supply PS can be implemented using various power converter architectures including, but not limited to, a buck-boost DC-DC converter. The power supply PS can also be derived from another power supply, such as by using a ferrite bead, inductor, diode, resistors, capacitors, or some combination thereof. The power supply PS can be implemented as described above and can be referenced to a power supply rail or to ground. The voltage $V_{POS}$ of the power supply can be set as high as the reverse breakdown of the laser diode LD and the voltage $V_{IN}$ can be set as high as the maximum voltage rating of the switch. As a non-limiting example, the voltage $V_{POS}$ of the power supply can be between about 0-40 volts and the supply voltage $V_{IN}$ can be between about 0-100 volts.

A pulse width can be determined by how quickly a current is ramped up to its peak and ramped back down. A high positive voltage across a parasitic inductance L1 of the laser diode LD increases the current in a positive direction and a large negative voltage across the inductance L1 can quickly decrease current, resulting in a short pulse width.

In FIG. 5, the power supply PS can apply a static reverse bias across the laser diode LD thereby raising the cathode voltage of the laser diode LD. By raising the cathode voltage of the laser diode LD, the effective discharge voltage across a parasitic inductance L1 of the laser diode LD becomes the voltage of the power supply PS ($V_{POS}$).

When the switch M1 turns ON, a large positive voltage $V_{IN}$–$V_{POS}$ is applied across the inductor L1, which quickly ramps up current. When the switch M1 turns OFF, the voltage $V_{POS}$ from the power supply PS (which can always be ON), effectively applies a large negative voltage across the parasitic inductance L1, and the current flows through the catch diode D1. The additional voltage added by the power supply PS can discharge the inductance L1 more quickly. The catch diode D1 can be a diode, which does not conduct in the reverse direction. As a diode, the catch diode D1 can naturally turn OFF when the current becomes zero, which also turns OFF the laser diode LD, resulting in a self-timing feature.

The circuit 140 of FIG. 5 can be reconfigured, as shown below in FIG. 6, such that the switch M1 is on the low side, rather than on the high side as in FIG. 5.

Figure 6:
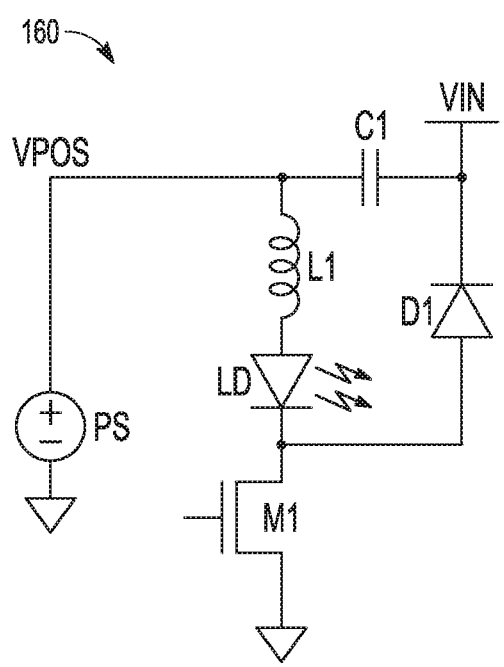
FIG. 6 is a schematic diagram of another example of a laser diode driver circuit that can implement various techniques of this disclosure.

FIG. 6 is a schematic diagram of another example of a laser diode driver circuit that can implement various techniques of this disclosure. The laser driver circuit 160 of FIG. 6 can include a switch M1, a laser diode LD, an optional capacitor C1, a power source PS, and a catch diode D1. A control logic circuit (not depicted) can control the switch M1.

In the example configuration shown in FIG. 6, the power supply PS can be coupled to the anode of the laser diode LD in order to set its operating point. The power supply PS can be implemented as described above. The optional capacitor C1 can be coupled to the anode of the laser diode LD.

Figure 7:
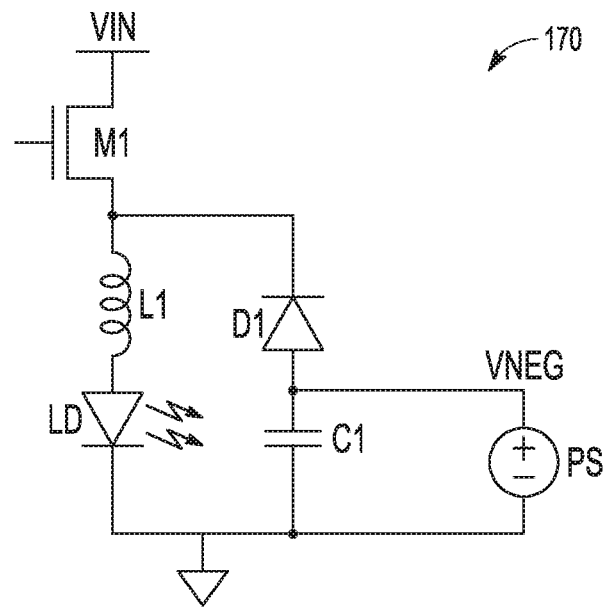
FIG. 7 is a schematic diagram of another example of a laser diode driver circuit that can implement various techniques of this disclosure.

FIG. 7 is a schematic diagram of another example of a laser diode driver circuit that can implement various techniques of this disclosure. The laser driver circuit 170 of FIG. 7 can include a switch M1, a laser diode LD, an optional capacitor C1, a power source PS, and a catch diode D1. A control logic circuit (not depicted) can control the switch M1.

In the example configuration shown in FIG. 7, the power supply PS, e.g., a negative terminal of the power supply, can be coupled to the cathode of the laser diode LD and the positive terminal can be coupled to the anode of the catch diode in order to set the DC operating point for the catch diode to turn ON. The power supply PS can be implemented as described above and can be referenced to the lowest supply potential of the circuit, e.g., the lower power supply rail or to ground. The negative voltage $V_{NEG}$ can be set up to the limit set by the laser diode LD and the supply voltage $V_{IN}$ can be set up to the limit of the switch. In a non-limiting example, the voltage $V_{NEG}$ of the power supply can be between about 0 volts to 40 volts and the supply voltage $V_{IN}$ can be between about 0-100 volts.

In the configuration in FIG. 7, the power supply PS can decrease the anode voltage of the catch diode D1. As a result, the drain voltage of the switch M1 can drop lower before the catch diode D1 turns ON.

The circuit 170 of FIG. 7 can be reconfigured, as shown below in FIG. 8, such that the switch M1 is on the low side, rather than on the high side as in FIG. 7.

Figure 8:
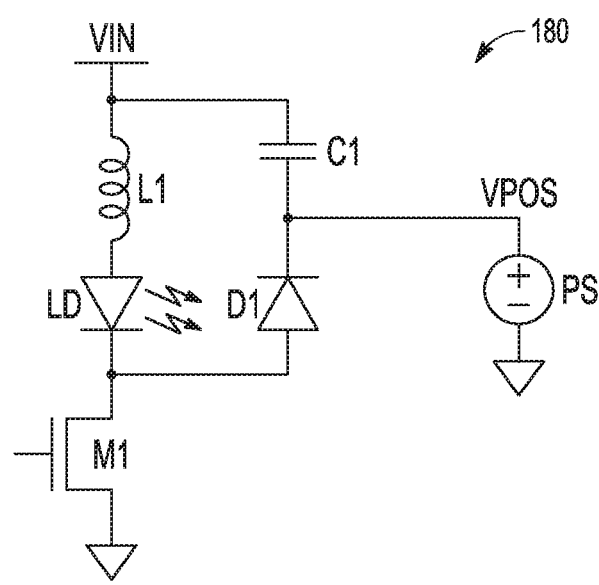
FIG. 8 is a schematic diagram of another example of a laser diode driver circuit that can implement various techniques of this disclosure.

FIG. 8 is a schematic diagram of another example of a laser diode driver circuit that can implement various techniques of this disclosure. The laser driver circuit 180 of FIG. 8 can include a switch M1, a laser diode LD, an optional capacitor C1, a power source PS, and a catch diode D1. A control logic circuit (not depicted) can control the switch M1.

In the example configuration shown in FIG. 8, the power supply PS, e.g., a positive terminal of the power supply, can be coupled to the cathode of the catch diode D1 in order to set its DC operating point. The power supply PS can be implemented as described above and can be referenced to the highest supply potential of the circuit, e.g., an upper power supply rail. The voltage $V_{POS}$ should be higher than the voltage $V_{IN}$. The optional capacitor C1 can be coupled to the anode of the laser diode LD.

Figure 9:
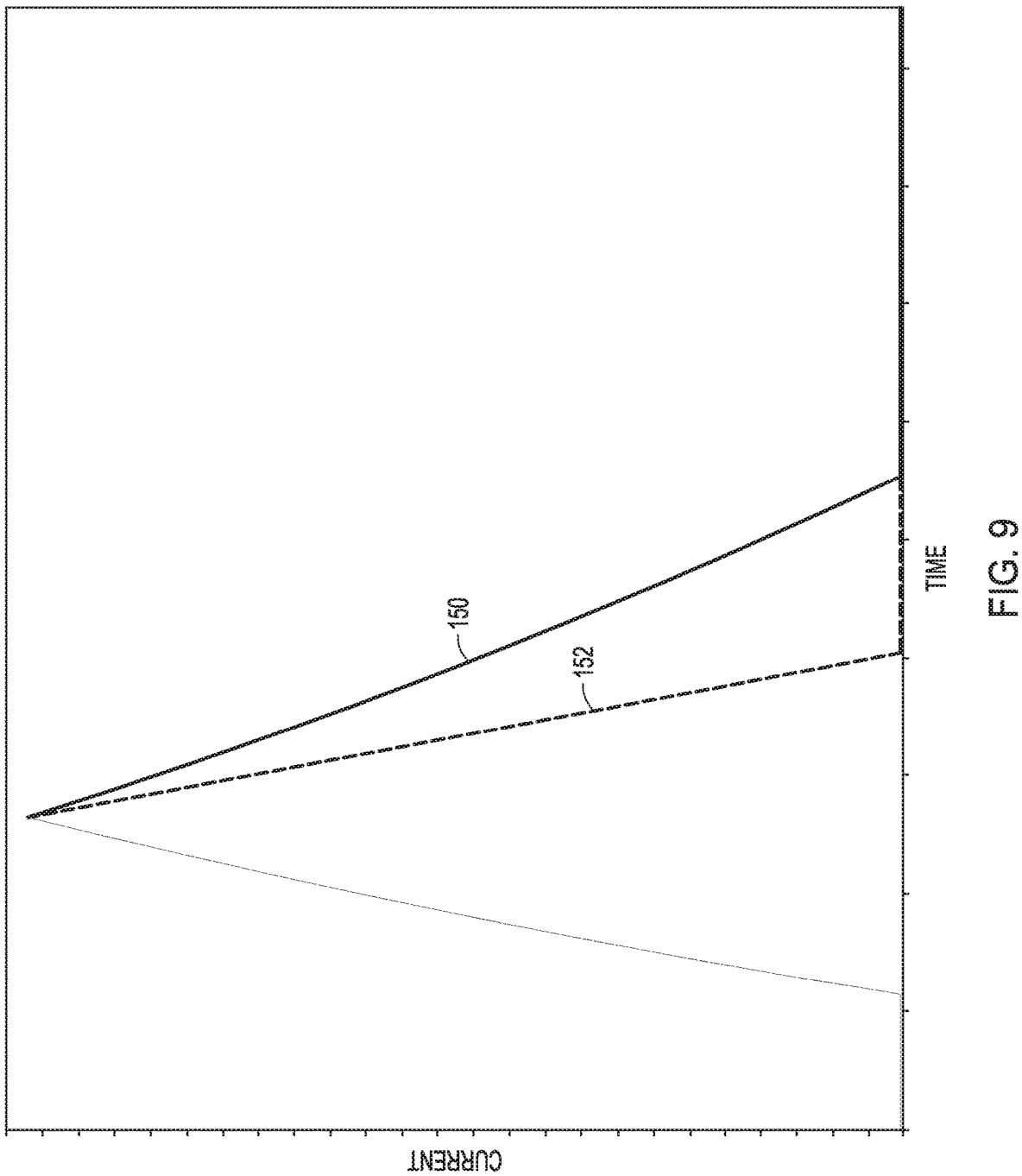
FIG. 9 depicts various waveforms associated with the circuit of FIG. 7.

FIG. 9 depicts various waveforms associated with the circuit of FIG. 7. The x-axis represents time and the y-axis represents the current through the laser diode LD. The first curve 150 represents the current through the parasitic inductance L1 without applying an additional voltage using the power supply PS of FIG. 7. The second curve 152 represents the current through the parasitic inductance L1 after applying the additional voltage using the power supply PS of FIG. 7. As seen in FIG. 9, the discharge slope of the second curve 152 is greater than the first curve 150, indicating that the additional voltage has discharged the inductance L1 more quickly.

As indicated above, the circuits of this disclosure can include an optional capacitor C1. This capacitor can be added in parallel or shared among many laser diodes to create a return path of the proper impedance. The power supply PS can be implemented using various power converter architectures including, but not limited to, a buck-boost DC-DC converter. The power supply PS can also be derived from another power supply, such as by using a ferrite bead, inductor, diode, resistors, capacitors, or some combination thereof. The power supply required can be low current and can be shared among all the lasers diode drivers.

For smaller values of capacitors, the laser current can charge up the capacitor and increase the reverse bias on the laser diode LD. In these cases, rising edge performance can be traded for falling edge performance. Using various switch timings, capacitor sizing can be used to shape the laser pulses. The charging voltage and the discharging voltage can be adjusted by changing the capacitance of the capacitor CL. For example, by adjusting a capacitance of the capacitor C1, the shape of a laser pulse can be adjusted, e.g., such as approximating a Gaussian shape, as shown in FIG. 10.

Figure 10:
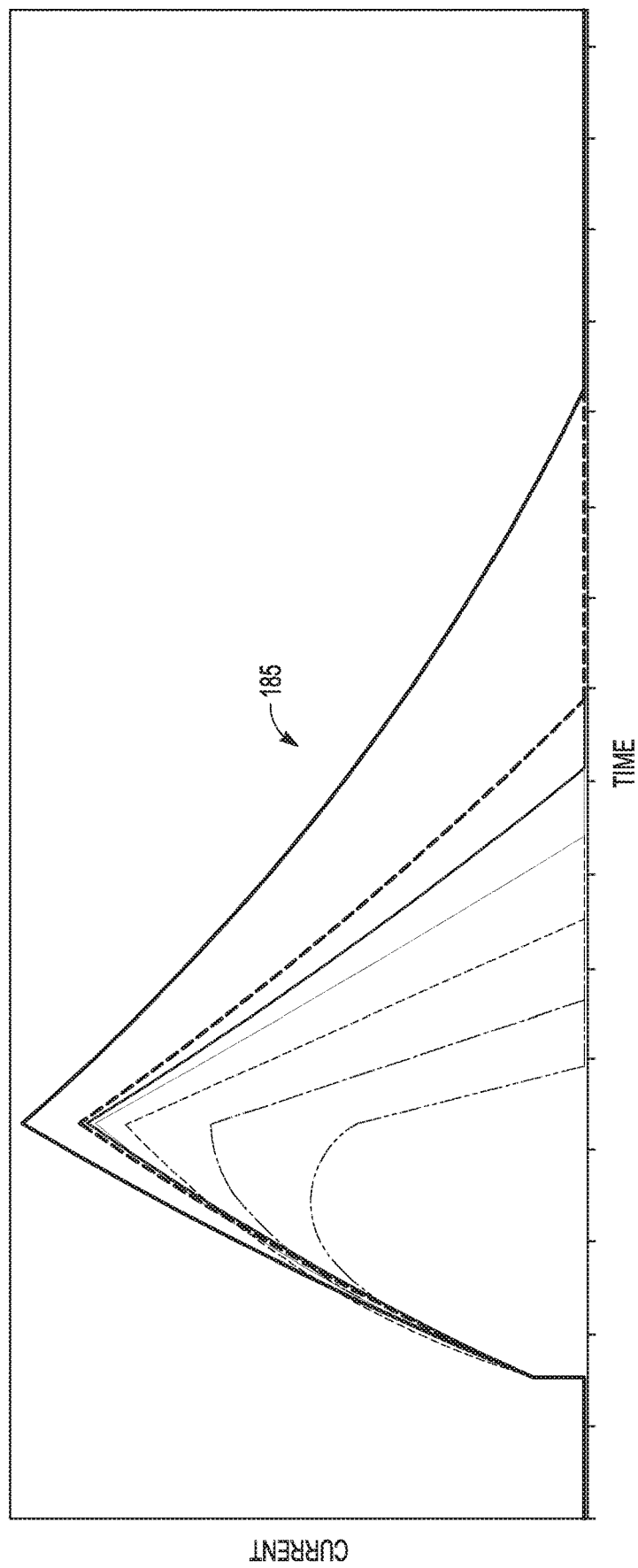
FIG. 10 depicts examples of various laser pulse shapes using various techniques of this disclosure.

FIG. 10 depicts examples of various laser pulse shapes using various techniques of this disclosure. The x-axis represents time and the y-axis represents the laser diode current. Various laser diode pulse shapes 185 are shown in FIG. 10 that can be achieved by adjusting a capacitance of a capacitor in a laser driver circuit. As the capacitance decreases, the fall time decreases, resulting in shorter pulse widths.

Figure 11:
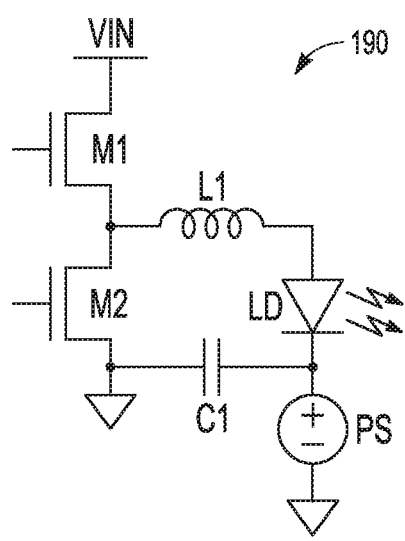
FIG. 11 is a schematic diagram of another example of a laser diode driver circuit that can implement various techniques of this disclosure.

FIG. 11 is a schematic diagram of another example of a laser diode driver circuit that can implement various techniques of this disclosure. The laser driver circuit 190 of FIG. 11 can include switches M1 and M2 coupled in series, a laser diode LD coupled between the switches M1 and M2, an optional capacitor C1, and a power source PS. A control logic circuit (not depicted) can control the switches M1 and M2. In some configurations, rather than be a switch, M2 can be a diode.

In the example configuration shown in FIG. 11, the power supply PS, e.g., a positive terminal of the power supply, can be coupled to the cathode of the laser diode LD in order to set its DC operating point. The power supply PS can be implemented as described above. The optional capacitor C1 can be coupled between the cathode of the laser diode LD and the source of the switch M2.

Figure 12:
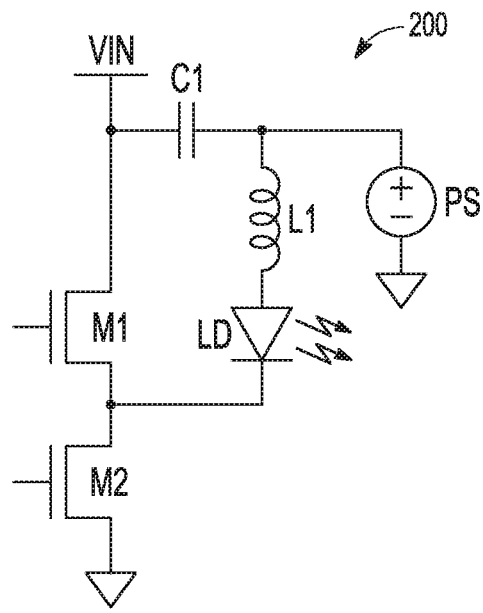
FIG. 12 is a schematic diagram of another example of a laser diode driver circuit that can implement various techniques of this disclosure.

FIG. 12 is a schematic diagram of another example of a laser diode driver circuit that can implement various techniques of this disclosure. The driver circuit 200 of FIG. 12 can include switches M1 and M2 coupled in series, a laser diode LD coupled between the switches M1 and M2, an optional capacitor C1, and a power source PS. A control logic circuit (not depicted) can control the switches M1 and M2. In some configurations, rather than be a switch, M1 can be a diode.

In the example configuration shown in FIG. 12, the power supply PS, e.g., a positive terminal of the power supply, can be coupled to the anode of the laser diode LD in order to set its DC operating point. The power supply PS can be implemented as described above. The optional capacitor C1 can be coupled between the anode of the laser diode LD and the drain of the switch M1.

Figure 13:
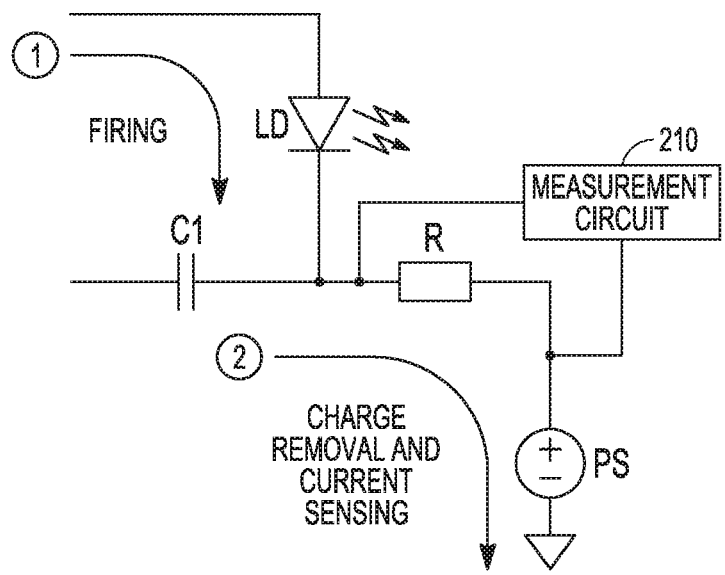
FIG. 13 is a schematic diagram illustrating an example of a laser diode current measurement circuit.

In any of the configurations described above, the capacitor C1 in conjunction with the power supply PS can be used to measure the average current through the laser diode LD, as described with respect to FIG. 13.

FIG. 13 is a schematic diagram illustrating an example of a laser diode current measurement circuit. Firing the laser diode D1 can store charge on the capacitor C1. However, because firing happens so quickly, a current waveform can be difficult to measure.

Using various techniques of this disclosure, charge during the firing phase can be removed slowly by the power supply PS. The charge removed can provide an average current through the laser diode LD. For example, a measurement circuit 210 can measure a voltage across a sense resistor $R_S$ having a known resistance. Using Ohm's law ($V = I \times R$) which the measurement circuit can use to calculate an average current through the laser diode LD. Then, the measurement circuit can use the determined average current through the laser diode LD to calculate an energy per pulse value, which can be used to ensure that the energy stays within an eye safety limit.

Figure 14:
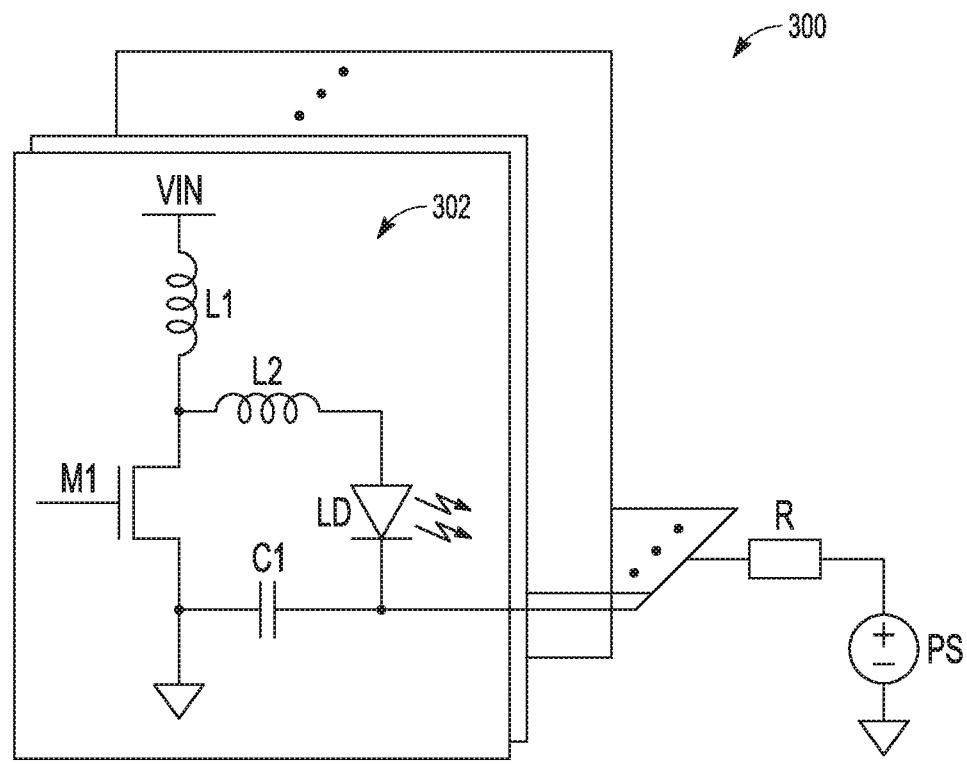
FIG. 14 is an example of an array of laser driver circuits driven by a single power source PS.
Figure 15:
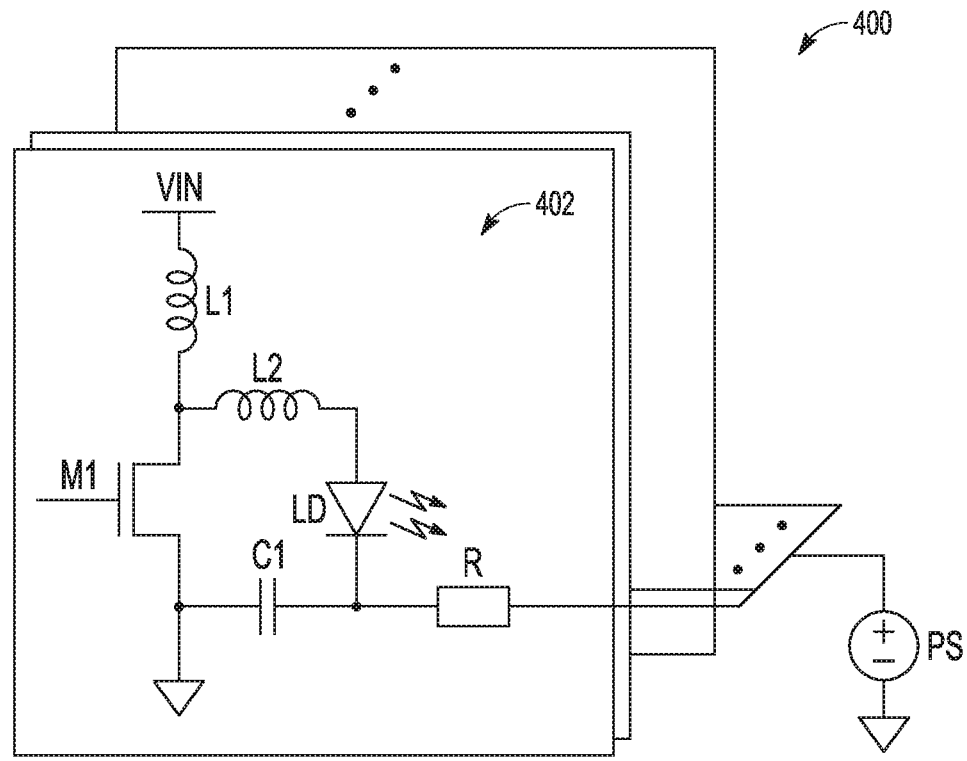
FIG. 15 is another example of an array of laser driver circuits driven by a single power source PS.

In some implementations, multiple laser driver circuits, e.g., forming an array of laser driver circuits, can be driven from a single power source, such as shown in FIGS. 14 and 15.

FIG. 14 is an example of an array of laser driver circuits driven by a single power source PS. In FIG. 14, an array 300 of laser driver circuits 302 coupled in parallel is shown. Any of the laser driver circuits described in this disclosure can be used in the array 300. The array 300 can be coupled to a shared component R where R can be one or more ferrite beads, diodes, inductors, capacitors, resistors or combinations thereof. The shared component R can be coupled to a power source PS shared by the array 300 that drives all the C1-LD nodes.

FIG. 15 is another example of an array of laser driver circuits driven by a single power source PS. In FIG. 15, an array 400 of laser driver circuits 402 coupled in parallel is shown. Any of the laser driver circuits described in this disclosure can be used in the array 400. Each laser driver circuit 402 can include a component R where R can be one or more ferrite beads, diodes, inductors, capacitors, resistors or combinations thereof. The component R can be coupled to a power source PS shared by the array 400 that drives all the C1-LD nodes.

NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A diode driver circuit comprising:
a laser diode having an anode and a cathode, the laser diode to receive a pulse of current;

a power supply to couple with the cathode of the laser diode, the power supply configured to apply a static reverse bias across the laser diode to decrease the current through the laser diode after firing the laser diode; and at least one electronic switch configured to control a forward current through the laser diode.

2. The diode driver circuit of claim 1, wherein the power supply is adjustable, and wherein the adjustable power supply is configured to change a pulse width of the current through the laser diode.

3. The diode driver circuit of claim 1, further comprising: a capacitor coupled to the laser diode.

4. The diode driver circuit of claim 3, coupled in parallel with another diode driver circuit, wherein the power supply is shared by the two diode driver circuits.

5. The diode driver circuit of claim 3; further comprising:
a diode coupled to the capacitor and an anode of the laser diode, wherein the power supply is coupled to the cathode of the laser diode and the anode of the diode.

6. The diode driver circuit of claim 1, further comprising:
a charging circuit path including an inductive element and the at least one electronic switch.

7. The diode driver circuit of claim 1, wherein the at least one electronic switch includes a first electronic switch and a second electronic switch, the diode driver circuit further comprising:
a charging circuit path including an inductive element and the first and second electronic switches.

8. The diode driver circuit of claim 1, wherein the at least one electronic switch includes a first electronic switch and a second s electronic witch coupled in series, and wherein a terminal of the laser diode is coupled to a node between the first electronic switch and the second electronic switch.

9. The diode driver circuit of claim 1, wherein the at least one electronic switch includes a first electronic switch, the diode driver circuit further comprising:
a diode, wherein the first electronic switch and the diode are coupled in series, and
wherein a terminal of the laser diode is coupled to a node between the first electronic switch and the diode.

10. A method of operating a laser diode, the method comprising:
coupling a voltage source to a cathode of the laser diode;
applying a pulse of current through the laser diode;
applying a static reverse bias voltage across the laser diode using the voltage source to decrease the current after firing the laser diode; and
adjusting the bias voltage to change a pulse width of the current.

11. The method of claim 10, further comprising:
coupling a capacitor to the laser diode.

12. The method of claim 11, further comprising:
adjusting a capacitance of the capacitor to adjust one or both of a charging voltage of the laser diode and a discharging voltage of the laser diode.

13. The method of claim 10, wherein applying a current pulse through the laser diode includes:
during a charging phase, controlling a first electronic switch to turn ON and charge an inductive element, and during a firing phase, controlling the first electronic switch to turn OFF to discharge the inductive element and apply the current pulse through the laser diode.

14. The method of claim 10, wherein applying a current pulse through the laser diode includes:
during a charging phase, controlling first and second electronic switches to turn ON and charge an inductive element; and
during a firing phase, controlling the second electronic switch to turn OFF to discharge the inductive element and apply the current pulse through the laser diode.

15. The method of claim 10, wherein applying a bias voltage to the laser diode using the voltage source to decrease the current after firing the laser diode includes:
applying a positive voltage to the cathode of the laser diode relative to a lower power supply rail or ground potential of a laser diode driver circuit.

16. The method of claim 10, wherein applying a bias voltage to the laser diode using the voltage source to decrease the current after firing the laser diode includes:
applying a negative voltage to the anode of the laser diode relative to an upper power supply rail of a laser diode driver circuit.

17. The method of claim 10, further comprising:
determining an average current through the laser diode.

18. A diode driver circuit comprising:
a laser diode to receive a pulse of current;
a power supply coupled to an anode of a diode, the power supply configured to apply a static reverse bias across the diode to decrease an anode voltage at the anode of the diode; and
at least one electronic switch configured to control a current through the laser diode.

19. The diode driver circuit of claim 18, further comprising:
a capacitor coupled to the diode.

20. A diode driver circuit comprising:
a laser diode having an anode and a cathode;
a voltage source coupled to the cathode of the laser diode;
means for applying a current pulse through the laser diode;
means for applying a static reverse bias voltage across the laser diode using the voltage source to decrease the current after firing the laser diode; and
means for adjusting the bias voltage to change a pulse width of the current pulse.

21. The diode driver circuit of claim 20, further comprising:
a capacitor coupled to the laser diode.

* * * * *

UNITED STATES PATENT AND TRADEMARK OFFICE
CERTIFICATE OF CORRECTION

PATENT NO. : 11,075,502 B2
APPLICATION NO. : 16/555506
DATED : July 27, 2021
INVENTOR(S) : Kuo et al.

Page 1 of 1

It is certified that error appears in the above-identified patent and that said Letters Patent is hereby corrected as shown below:

In the Claims

Column 11, Line 17, Claim 5, delete "claim 3;" and insert --claim 3,-- therefor

Column 11, Line 32, Claim 8, delete "s electronic witch" and insert --electronic switch-- therefor Column 12, Line 4, Claim 13, delete "element," and insert --element;-- therefor Column 12, Line 4, Claim 13, after "and", insert a linebreak Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*